(12) United States Patent
Sussman et al.

(10) Patent No.: US 10,067,745 B2
(45) Date of Patent: Sep. 4, 2018

(54) RANDOM NUMBER GENERATOR

(75) Inventors: Benjamin J. Sussman, Ottawa (CA); Philip J. Bustard, Ottawa (CA)

(73) Assignee: National Research Council of Canada, Ottawa, ON (CA)

( * ) Notice: Subject to any disclaimer, the term of this patent is extended or adjusted under 35 U.S.C. 154(b) by 301 days.

(21) Appl. No.: 14/343,602

(22) PCT Filed: Sep. 9, 2011

(86) PCT No.: PCT/CA2011/001007
§ 371 (c)(1),
(2), (4) Date: May 7, 2014

(87) PCT Pub. No.: WO2013/033808
PCT Pub. Date: Mar. 14, 2013

(65) Prior Publication Data
US 2015/0154007 A1 Jun. 4, 2015

(51) Int. Cl.
G06F 7/58 (2006.01)
H03K 3/84 (2006.01)

(52) U.S. Cl.
CPC ............... *G06F 7/588* (2013.01); *H03K 3/84* (2013.01)

(58) Field of Classification Search
CPC ....................................................... G06F 7/588
See application file for complete search history.

(56) References Cited

U.S. PATENT DOCUMENTS 6,609,139 B1 * 8/2003 Dultz .................. G06F 7/588
708/250
6,919,579 B2 7/2005 Amin et al.
(Continued)

FOREIGN PATENT DOCUMENTS

JP 2009070009 4/2009
WO 2007124088 A2 11/2007
(Continued)

OTHER PUBLICATIONS

Headley III, Clifford et al., Unified description of ultrafast stimulated Raman scattering in optical fibers, Oct. 1996, Journal of the Optical Society of America B, vol. 13, No. 10, pp. 2170-2177.*
RP Photonics, Pulse Duration, Jun. 9, 2010, pp. 1-3.*
Physics Lecture, University of Wisconsin-Madison, uw.physics.wisc.edu/~himpsel/107/Lectures/Phy107Lect24b.pdf.*
A Primer on Photodiode Technology, http://home.sandiego.edu/~ekim/photodiode/pdtech.html.*
Wayback machine screen shot Summary of uw.physics.wisc.edu/~himpsel/107/Lectures/Phy107Lect24b.pdf.*
(Continued)

*Primary Examiner* — Andrew Caldwell
*Assistant Examiner* — Emily E Larocque
(74) *Attorney, Agent, or Firm* — Moffat & Co.

(57) ABSTRACT

A method of generating a random number that involves applying pulses of energy to amplify a quantum mechanical vacuum fluctuation to generate one or more macroscopic fields having one or more physical properties (e.g. phase or energy) that are random and measurable, and, measuring at least one of the physical properties to obtain a value for the physical property, the value of the physical property being a random number. Measuring the phase of a Stokes signal generated in a transient Raman scattering process is one way of generating the random number as the phase of the Stokes signal is random. This method can produce random numbers faster than prior art methods as the real numbers generated can be converted to binary to produce more than one random bit and the measurement process itself is faster permitting more rapid data collection rates and more rapid turn-on times.

7 Claims, 2 Drawing Sheets

(56) References Cited

U.S. PATENT DOCUMENTS

| | | | |
|---|---|---|---|
| 7,284,024 B1* | 10/2007 | Trifonov | B82Y 10/00 708/256 |
| 7,428,562 B2 | 9/2008 | Beausoleil et al. | |
| 7,596,322 B2 | 9/2009 | Tomaru et al. | |
| 7,738,793 B2 | 6/2010 | Tomaru et al. | |
| 2003/0219119 A1 | 11/2003 | Italia et al. | |
| 2005/0071400 A1* | 3/2005 | Ribordy | H04L 9/0852 708/250 |
| 2006/0115086 A1 | 6/2006 | Beausoleil et al. | |
| 2006/0280509 A1* | 12/2006 | Tomaru | H04L 9/0662 398/188 |
| 2006/0288062 A1 | 12/2006 | Luo et al. | |
| 2007/0260658 A1* | 11/2007 | Fiorentino | B82Y 10/00 708/250 |
| 2008/0040410 A1 | 2/2008 | Vartsky et al. | |
| 2008/0065710 A1 | 3/2008 | Fiorentino et al. | |
| 2008/0232814 A1 | 9/2008 | Ichimura et al. | |

FOREIGN PATENT DOCUMENTS

| | | |
|---|---|---|
| WO | 2010033013 A3 | 3/2010 |
| WO | 2011023501 A1 | 3/2011 |

OTHER PUBLICATIONS

Wayback machine screen shot Summary of http://home.sandiego.edu/~ekim/photodiode/pdtech.html.*

Bing QI et al., "High-speed quantum random number generation by measuring phase noise of a single-mode laser", Optics Letters, vol. 35, Issue 3, pp. 312-314 (2010).

Bing QI et al., "Experimental demonstration of a high speed quantum random number generation scheme based on measurring phase noise of a single mode laser", Center for Quantum Information and Quantum Control, Dept. of Electrical and Computer Engineering and Dept. of Physics, University of Toronto (2009).

J.F. Dynes et al., "A High Speed, Post-Processing Free, Quantum Random Number Generator", Appl. Phys. Lett. 93, 031109 (2008); doi: 10.1063/1.2961000 (3 pages).

Ma Hai-Qiang et al., "A Random Number Generator Based on Quantum Entangled Photo Pairs", Chinese Phys. Lett. 21 1961 (2004); doi: 10.1088/0256-307X/21/10/027.

I. Reidler et al., "Ultrahigh-Speed Random Number Generation Based on a Chaotic Semiconductor Laser", Phys. Rev. Lett. 103, 024102 (2009).

Min Ren et al., "Qauntum random-number generator based on a photon-number-resolving detector", Phys. Rev. A 83, 023820 (Feb. 23, 2011).

Yong Shen et al., "Practical quantum random number generator based on measuring the shot noise of vacuum states", Phys. Rev. A 81, 063814 (2010).

Andre Stefanov et al., "Optical quantum random number generator", (1999).

Caitlin R.S. Williams et al., "Fast physical random number generator using amplified spontaneous emission", Optics Express, vol. 18, Issue 23, pp. 23584-23597 (2010).

Random number equipment manufacturer: http://www.idquantique.com/true-random-number-generator/quantis-usb-pcie-pci.html, as captured on Jul. 29, 2011.

"A fast and compact quantum random number generator", Rev. Sci. Instrum. 71, 1675 (2000); doi: 10.1063/1.1150518 (6 pages).

"A generator for unique quantum random number based on vacuum states", Nature Photonics 4, 711-715 (2010 doi: 10.1038/nphoton.2010.197.

"Truly random number generation based on measurement of phase noise of a laser", Phys. Rev. E 81, 051137 (2010).

Gerry C, Knight P. (2005) Introductory Quantum Optics, chapters 2, 3 and 6. (Cambridge University Press).

Juels A, Jakobsson M, Shriver E, Hillyer B. (2000) How to turn loaded dice into fair coins. Information Theory, IEEE Transactions. 46, 911-921.

Lee K, Sussman BJ, Nunn J, Lorenz V, Reim K, Jaksch D, Walmsley I, Spizzirri P, Prawer S. (2010) Comparing phonon dephasing lifetimes in diamond suing transient coherent ultrafast phonon spectroscopy. Diamond and Related Materials. 19, 1289-1295.

Li, et al. "All-fiber photon-pair source for quantum communications: Improved jeneration of correlated photons," Optics Express, vol. 12, No. 16, pp. 3737-3744, (2004).

Raymer M, Walmsley IA. (1990) Quantum coherence properties of stimulated raman scattering. Progress in Optics. 28,181.

Raymer MG, Mostowski J. (1981) Stimulated raman scattering: Unified treatment of spontaneous initiation and spatial propagation. Phys, Rev. A 24, 1980-1993.

Von Neumann J. (1951) Various techniques used in connection with random digits. Nat. Bur. Stand., Appl. Math Ser. 12, 36-38.

Wahl M, Leifgen M, Berlin M, Rohlicke T, Rahn H-J, Benson O. (2011) An ultrafast quantum random number generator with provably bounded output bias based on photon arrival time measurements. Applied Physics Letters. 98, 171105.

Wei W, Guo H. (2009) Bias-free true random-number generator. Opt. Lett. 34, 1876-1878.

Bloembergen, N. "The Stimulated Raman Effect," Am. J. Phys. 35, 989 (1967).

A printout of C source code from Marsaglia, G., "Diehard" CD-ROM obtained from <http://stat.fsu.edu:80/pub/diehard/cdrom/source/> as archived on Oct. 24, 1997 by the Wayback Machine Internet Archive at <https://web.archive.org/web/19971024153113/http://stat.fsu.edu:80/pub/diehard/cdrom/source/>.

Kim, "A Primer on Photodiode Technology", University of San Diego, Retrieved from: https://web.archive.org/web/20041211180434/http://home.sandiego.edu/~ekim/photodiode/pdtech.html, Dec. 11, 2004 (Nov. 12, 2004).

Official Action, Canadian Patent Application No. 2,847,584, dated Mar. 29, 2018.

* cited by examiner

RANDOM NUMBER GENERATOR

FIELD OF THE INVENTION

The present invention is related to methods for generating random numbers.

BACKGROUND OF THE INVENTION

The rapid and effective generation of random number sequences is one of the grand challenges of modern computation. These sequences are used as keys for secure communications, as orderings for random sampling in simulations and data analysis, and are an important part of trustworthy gaming and lotteries. Devices that use random numbers are ubiquitous and as the spread of modern technology grows, so does the number of technologies that use them.

Nearly every online bank transaction, secure communication between governments and their embassies, signal from command & control centers to troops and aircraft, and large-scale computer simulation relies on these sequences. Hardware in supercomputers, personal computers, smart phones like iPhones™ and Blackberrys™, and military encryption devices all implement random number generators in some form.

Traditional methods for generating random numbers rely on deterministic algorithms or deterministic physical processes. Although these algorithms are deterministic, they are designed to produce numbers that satisfy certain characteristics that give the appearance of being random. For example, the digits of pi can be used as random numbers, but they are deterministically calculable and hence unsuitable for a cryptographic key, because if an adversary determines the algorithm used, the process is compromised. There is no traditional computational method for generating random numbers that is not deterministic. Therefore traditional techniques are vulnerable to compromise. Computationally generated random numbers are often called pseudo-random numbers for these reasons.

Since all classical algorithms are deterministic, the only way to generate truly random numbers is to utilize a suitable random physical effect. Quantum mechanical systems are the only known entities that have nondeterministic behaviour. While the evolution of the quantum mechanical probability distribution is deterministic, the outcome of a particular measurement is not. If the uncertainty of a measurement outcome can be mapped to a sequence of numbers, it can be used as a source of random number generation. This quantum noise is not simply due to lack of knowledge of an observer, but is due to the very nature of physical reality. Random number generators based on quantum effects are called true random number generators. The use of quantum effects for random number generators is in its infancy and there are a small number of competing methods at present.

As an example of quantum random number generation, one of the current state-of-the-art methods (ID Quantique 2011) is to attenuate a conventional light source (less than one photon per unit time) and project that light on to a 50% beam splitter. The photon may be randomly transmitted or reflected. The two cases correspond to the generation of either a 1 or a 0.

Many state-of-the-art quantum random number generation methods, including the ID Quantique method (ID Quantique 2011), generate only one bit of information per measurement corresponding to one of two states in which a physical system can exist. To generate large or many random numbers therefore requires a large number of measurements, slowing the rate of random number generation.

Recently, a method for generating random numbers based on measuring phase noise of a single-mode laser has been developed (Qi 2009; Qi 2010). The phase noise of a laser is due to electric field fluctuations caused by spontaneous photon emission and results in linewidth broadening. This method involves continuous wave pumping at low intensity followed by measuring coherence decay. The continuous wave pumping is done at low intensity in order to minimize the relative effects of additional classical noises. This may be a challenging condition to maintain with stability.

There has also been recent work on using amplified spontaneous emission for fast physical random number generation (Williams 2010). This method involves measuring energy fluctuations in broadband, incoherent, unpolarized optical noise generated through amplified spontaneous emission (ASE) in an amplifier. Like the method of Qi (Qi 2009; Qi 2010) discussed above, this method uses continuous wave pumping to amplify the effect of the energy fluctuations into a measurable signal. Further, this method measures energy fluctuations rather than phase.

There has also been recent work on using polarization states of spontaneous parametric down-converted photons for generating random numbers (Suryadi 2010). One problem with such a method is that measurement of polarization states only provides a single random bit, which is like most state-of-the-art quantum random number generation methods. Thus, to generate large or many random numbers, a large number of measurements are required, slowing the rate of random number generation.

There remains a need for true random number generators that can generate random numbers more quickly and with easier detection using a simple process based on quantum effects of a physical system.

SUMMARY OF THE INVENTION

It has now been found that by using pulses of energy to amplify quantum mechanical vacuum fluctuations that seed a spontaneous physical process to generate a field having a random physical property (e.g. phase or energy), the value of the physical property of the generated field can be used as a true random number.

Thus, there is provided a method of generating a random number comprising: applying pulses of energy to amplify a quantum mechanical vacuum fluctuation to generate one or more macroscopic fields having one or more physical properties that are random and measureable; and, measuring at least one of the physical properties to obtain a value for the physical property, the value of the physical property being a random number.

The physical property of the macroscopic field is preferably the phase or energy of the field, more preferably the phase of the field.

Any suitable spontaneous physical process can be used that involves a quantum mechanical vacuum fluctuation that can be amplified by energy pulses to generate a field. Some suitable physical processes include optical processes, particle physics processes, condensed matter physics processes and any other quantized field process than can be amplified. Spontaneous optical processes are preferred, for example, Raman scattering, spontaneous parametric down conversion, spontaneously seeded optical parametric amplification or amplified spontaneous emission in a laser. Raman scattering is particularly preferred.

Pulses of energy used to amplify the quantum mechanical vacuum fluctuation may be generated by any suitable method, for example by lasers (optical pulses), coherent electron beams, chemical changes, electrical pulses or acoustic pulses. For optical processes, pulsed lasers are preferred. Pulsed lasers are advantageous when contrasted with continuous wave pumps because pulsed lasers define a specific time bin and have higher intensities. This permits much more rapid data collection and initiation thereby generating random numbers much more rapidly. Transient Raman scattering from Raman scattering interactions produced by pulsed lasers is a particularly preferred physical process.

The duration and energy of energy pulses for amplifying the quantum mechanical vacuum fluctuation may vary depending on the type of physical process, medium, the detection method and/or the environment. Pulse durations from attoseconds (as) to milliseconds (ms) are typical. However, it is a particular advantage of the present invention, especially in the context of Raman processes, that pulse durations of 100 picosecond (ps) or less, for example about 1 femtosecond (fs) to 10 ps or even about 1 fs to 1 ps, may be used. This dramatically increases data collection rate and therefore the rate of generating random numbers. Pulse energies may be in a range of from picojoules to joules, preferably nanojoules to millijoules, for example about 1 nanojoule to about 500 millijoules.

Measuring the phase of the generated field is a particularly preferred embodiment of the present invention. Fields may be expressed in a basis of sinusoidal functions (e.g. cosine waves) that vary periodically over time. When the field generated in the present method is compared to a reference field of the same nature, the two fields may be offset in spatial positioning of their amplitude maximums, i.e. the generated field and reference field may have different phases. Taking the position of the reference field as 0, the extent of offset of the generated field is its phase relative to the reference field and the phase value can be expressed as a real number that varies between 0 and 360° (or between 0 and $2\pi$ radians). Therefore, the measured phase value of the generated field is a real number that may have any number of decimal places up to that allowed by the accuracy of the measurement. The phase value itself is a random number. However, when the phase value is converted from decimal to binary more than one random bit is generated, and in many cases many more than one random bit is generated. If the phase measurement is digitized with $2^n$ bits, then $2^n$ random binary bits are generated provided the resolution is sufficient.

The binary conversions of the value from subsequent measurements may be strung together or concatenated to form even longer strings of random bits. To generate random numbers from such strings of bits, one need only select a suitably long portion of the binary string and convert the selected portion from binary to a number of whatever base is desired. For example, to generate a random number from 0-32 in base 10, it would be necessary to select a sequence of 6 bits from the binary string and convert the selection to base 10. It is a great advantage of the present method that it can generate a large number of random bits in one measurement thereby considerably reducing the number of operations necessary to generate strings of bits long enough to provide adequate generation of random numbers.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which.

DESCRIPTION OF PREFERRED
EMBODIMENTS

In a preferred embodiment, transient Raman interactions serve as the physical process from which quantum mechanical vacuum fluctuations are amplified to generate a field for which the phase can be measured.

Figure 1:
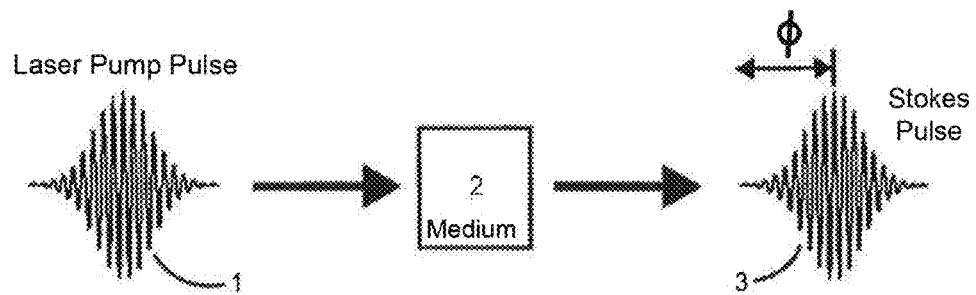
FIG. 1 depicts a schematic diagram showing a laser pump pulse interacting with a Raman-active medium to produce a Stokes shifted signal pulse with a random phase phi ($\phi$).

Referring to FIG. 1, when laser pump pulse 1 interacts with Raman active medium 2 (e.g. bulk crystal or fibre) it produces a new light pulse at a shifted frequency (i.e. Stokes shifted signal pulse 3) and generates an excitation in the material. Provided the interaction is a transient Raman scattering interaction, the coherence length of Stokes signal 3 is equal to its temporal length. That is, the electric field of Stokes signal 3 has a definite phase, $\phi$, relative to a reference. The phase of the Stokes signal generated is random, and is set by the vacuum fluctuations of the medium. When the Raman gain is large, the Stokes signal energy will be large enough to measure with single shot interferometry. After waiting for the material excitation to decay (typically about 1-10 ps), the process can be repeated to generate the next random number.

Figure 2A:
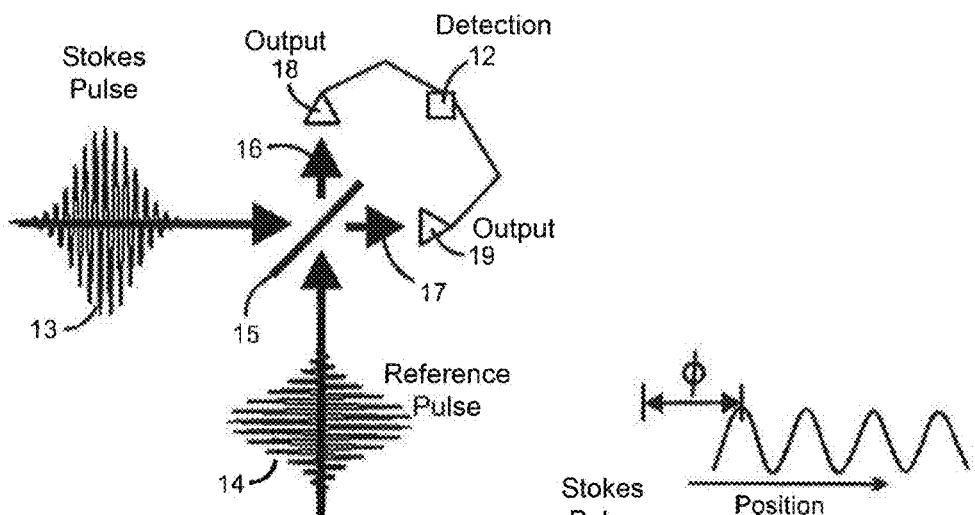
FIG. 2 depicts two methods of measuring the phase of the Stokes shifted signal pulse produced in FIG. 1. In both heterodyne detection (FIG. 2A) and spatial fringe measurement (FIG. 2B), the Stokes signal is compared with a reference signal via a beamsplitter and the interference is measured. In heterodyne detection (FIG. 2A), or similar type detection, a comparison of two arms from the beamsplitter can be used to measure the quadrature and hence the phase. Alternatively (FIG. 2B), a small angle between the reference signal and Stokes signal will produce spatial fringes that can be measured directly, where the phase, $\phi$, of the fringes is the random number.
Figure 2B:
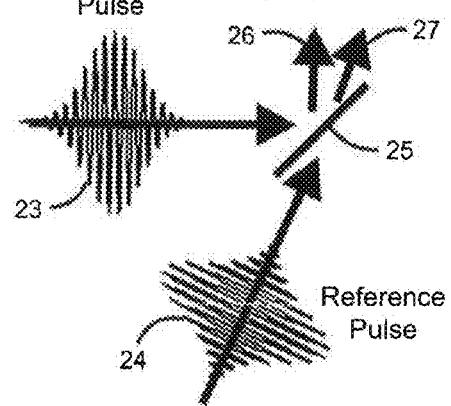

To measure the phase of a Stokes signal as generated in accordance with FIG. 1, the Stokes signal is compared to a reference signal (FIG. 2) by passing the two signals through a beamsplitter and measuring the interference. This can be done in a number of ways. In heterodyne detection (FIG. 2A) or similar type detection, Stokes signal 13 and reference signal 14 meet at beamsplitter 15 where interference patterns 16,17 are formed in two output arms 18, 19. A comparison of the two arms with heterodyne detection 12 can be used to measure quadrature and hence phase. Alternatively (FIG. 2B), a small angle between reference signal 24 and Stokes signal 23 will produce spatial fringes 26, 27 as they pass through beamsplitter 25 that can be measured directly, where the phase, $\varphi$, of the fringes is the random number.

In general the interference between the reference and the signal will produce interference fringes and the phase of these fringes will be the measured signal. The phase of the fringes can be measured in a spectrometer, or camera (e.g. a charge-coupled device (CCD)), or via a method like heterodyne detection or balanced heterodyne detection. In some measurement methods inherent biases in the equipment (for example a CCD measuring brighter in some places than others) may introduce undesired order, however, known algorithmic techniques for the particular method or device can be used to correct for this bias. In some measurement methods, constant phase is desired and the duration and intensity of the pulses is important to avoid phase jumps in the cosine wave. Practical consideration such as cost and availability of equipment dictate choice of how phase is measured and ultimately the speed of generating random numbers.

In general, the use of transient Raman interactions as the physical process advantageously provides extremely high data rates since typical optical phonon decay times are very rapid (less than 10 ps), which implies that data rates approaching $1 \times 10^{12}$ Hz are possible. Further, the use of transient Raman scattering requires relatively short pump pulses and results in short Stokes pulses. Raman systems are thus very responsive, so ultrafast pulses (<ps) can be used as a pump and the phase encoded on an ultrafast pulse. Collectively, these aspects increase the rate and turn-on time for which random numbers can be generated.

Further, the Raman scattering approach is not a low photon number approach that requires less than one photon per shot. High photon signals produced in Raman scattering are more amenable to easy measurement so that sensitive detectors are not required. Also, Raman scattering gives access to a wide range of wavelengths, suitable for various detectors, materials, or environments.

Furthermore, the use of phase measurements rather than energy measurements is particularly advantageous. Classical energy fluctuations in the energy pump can lead to classical energy fluctuations in the output. In such a case, the random numbers produced may not be quantum random numbers since the classical fluctuations may dominate the quantum fluctuations. Thus, the random numbers produced from energy measurements may not be quantum in origin and may not be true random numbers. This may be a particularly serious problem for prior art continuous wave techniques as well as they can be especially sensitive to classical energy fluctuations in the energy pump. In contrast, phase measurements are highly insensitive to pump pulse energy fluctuations, ensuring that the random numbers generated are quantum in origin and are therefore true random numbers.

EXAMPLE

Figure 3:
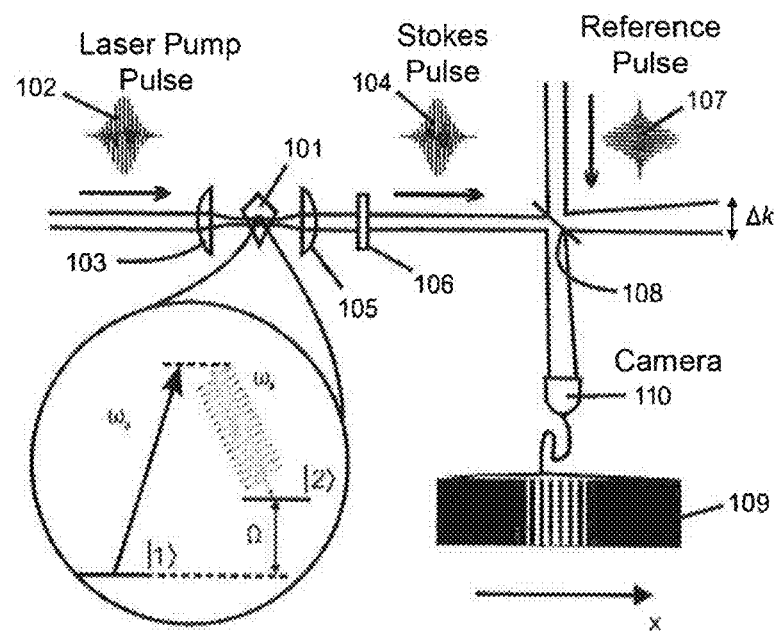
FIG. 3 depicts a schematic diagram of a Raman random number generator in accordance with the present invention. The inset shows a $\Lambda$-level diagram showing the Raman transition in diamond used to generate the randomly-phased Raman Stokes light.

In one embodiment of a Raman random number generator of the present invention as shown in FIG. 3, a diamond is used as the Raman active medium. As an optical material, diamond is unparalleled in its high Raman gain and wide transparency range, permitting a compact and reliable design. Linearly-polarized pump pulse 102 with duration $\tau_p=100$ ps, energy $E_p=1.6$ mJ, and wavelength $\lambda_p=532$ nm, is focused by lens 103 into a 3 mm CVD diamond plate 100 oriented along the (<100>) axis. The pump excites an optical phonon with vibrational frequency $\Omega=1332$ cm$^{-1}$, and a Stokes pulse 104 with random phase and with mean energy 0.16 µJ is emitted at 573 nm (see inset), which is collimated with lens 105 and filtered with bandpass filter 106 to filter out the pump field. This gives a photon conversion efficiency to the Stokes field of $\eta=0.11$. The dephasing time for the vibrational excitation is estimated at $\Gamma^{-1}=7$ ps, based on the Raman linewidth and transient coherent ultrafast phonon spectroscopy measurements (Lee 2010), yielding $\Gamma\tau_p=14$. Using $\eta$ and an analytic result for the Stokes pulse energy taken from the fully quantum model (Raymer 1981), the Raman gain (gL) is estimated to be about 29, where g is the steady-state Raman gain coefficient and L is the gain length of the diamond. The experimental parameters therefore satisfy the necessary conditions for transient SRS (gL>$\Gamma\tau_p$y) in the high-gain limit (gL$\Gamma\tau_p$>>1) (Raymer 1990). The emitted Stokes light therefore has a smooth temporal profile with a well-defined, but random, phase.

Reference pulse 107 used for the phase measurement is generated at the Stokes wavelength, again by stimulated Raman scattering in diamond. Stokes pulse 104 and reference pulse 107 are combined at beamsplitter 108. A small lateral shear $\Delta k$ is introduced and the resulting fringe pattern 109 is recorded on a 2048-pixel line array charge-coupled device (CCD) camera 110 operating at 200 Hz. The fringe measurement is a comparison of the first Stokes field $|A_S|e^{-i(\Delta kx+\phi_S)}$ with the reference Stokes field $|A_r|e^{-i(\phi_r)}$, where $A_{S,r}$ are the field amplitudes, $\Delta k$ is the reference field wavevector component in the plane of the detector, x is the position coordinate along the camera array, and $\phi_{r,S}$ are the field phases. This yields an interferogram given by:

$$S_{int} \propto |A_S||A_r|\cos(\Delta kx+\Delta\phi)$$

where $\Delta\phi=(\phi_S-\phi_r)$ is a phase factor lying randomly on the interval $0 \leq \Delta\phi \leq 2\pi$ due to the quantum mechanical origin of $\phi_S$.

Figure 4:
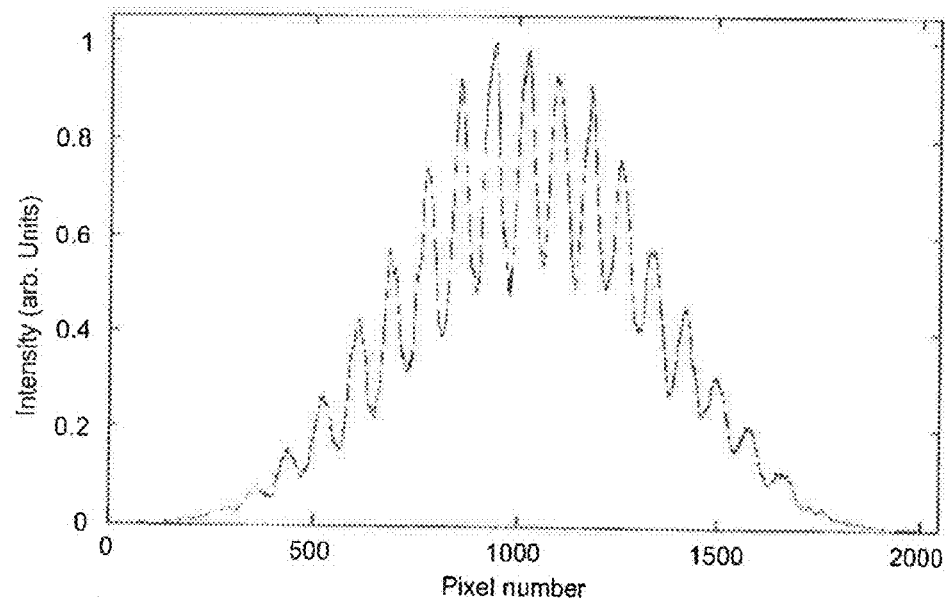
FIG. 4 depicts a typical interferogram of two Stokes pulses generated by spontaneously initiated stimulated Raman scattering. The fringe phase is random for each measurement.

FIG. 4 shows a typical interferogram. As the process relies on the large amplification of vacuum fluctuations, the measurement is in the macroscopic limit of a quantum phenomenon. The interferograms are used to generate random bits by fitting to a cosine and extracting the phase. A higher precision measurement produces a larger number of bits. The phase measurement may therefore produce multiple bits per shot. Here 6 bits per measurement are generated (distinguishing $2^6=64$ possible phases). Any possible bias in the phase measurement is removed by post-processing using a fair bit extractor algorithm (von Neumann 1951; Juels 2000). The ultimate limit for bit generation per shot is set by the minimum phase defined $\Delta\phi_{min}$, which depends on the number of photons per pulse n as $\Delta\phi_{min} \sim 1/n$ (Gerry 2005).

The randomness of the Raman phase measurements was tested using the standard DIEHARD statistical test suite (Marsaglia 1995). As shown in Table 1, the data set passed all the tests, confirming that the measured optical phase is a suitable source of random numbers.

TABLE 1

| Statistical Test | p-value | Result |
| --- | --- | --- |
| Birthday spacings | 0.140289 (KS) | Success |
| Overlapping 5-permutation | 0.234407 | Success |
| Binary rank test for 31 × 31 matrices | 0.857819 | Success |
| Binary rank test for 32 × 33 matrices | 0.888548 | Success |
| Binary rank test for 6 × 8 matrices | 0.595644 (KS) | Success |
| Bitstream | 0.11249 | Success |
| OPSO | 0.0547 | Success |
| OQSO | 0.0806 | Success |
| DNA | 0.0247 | Success |
| Count the 1's test | 0.217644 | Success |
| Count the 1's test for specific bytes | 0.171729 | Success |
| Parking lot | 0.437972 (KS) | Success |
| Minimum distance | 0.312133 (KS) | Success |

TABLE 1-continued

| Statistical Test | p-value | Result |
| --- | --- | --- |
| 3D Spheres | 0.012979 (KS) | Success |
| Squeeze | 0.344869 | Success |
| Overlapping sums | 0.100233 (KS) | Success |
| Runs | 0.101465 (KS) | Success |
| Craps | 0.213158 | Success |

For tests with multiple p-values the worst case was selected.
KS indicates a Kolmogorov-Smirnov test.

The demonstrated Raman phase technique has the potential to generate very high bit rates and rapid turn-on times because the non-resonant nature of the Raman interaction allows broad-bandwidth, ultrashort pulses to be used and because rapid system dephasing promptly resets the vacuum state before each phase is generated. For typical bulk solid dephasing times of 1-10 ps, terahertz data rates and beyond may be feasible.

REFERENCES

The contents of the entirety of each of which are incorporated by this reference.

Amin M H S, Duty T, Omelyanchouk A, Rose G, Zagoskin A, Blais A. (2005) Quantum bit with a multi-terminal junction and loop with a phase shift. U.S. Pat. No. 6,919,579 issued Jul. 19, 2005.

Beausoleil R G, Munro W J, Spiller T P. (2008) Self-Authenticating Quantum Random Number Generator. U.S. Pat. No. 7,428,562 issued Sep. 23, 2008.

Cerf N, Lamoureux L P, Niset J. (2011) Network distributed quantum random number generation. International Patent Publication WO 2011/023501 published Mar. 3, 2011.

Dynes J F, Yuan Z L, Sharpe A W, Shields A J. (2008) A high speed, post-processing free, quantum random number generator. *Applied Physics Letters.* 93, 031109 (3 pages).

Fiorentino M, Munro W J, Beausoleil R G, Spillane S, Santori C. (2007) Optical-based self-authenticating quantum random number generators. United States Patent Publication US 2007/0260658 published Nov. 8, 2007.

Fiorentino M, Beausoleil R G, Santori C. (2008) Optical-based self-authenticating quantum random number generators. United States Patent Publication US 2008/0065710 published Mar. 13, 2008.

Gabriel C, Wittmann C, Sych D, Dong R, Mauerer W, Andersen U L, Marquardt C, Leuchs G. (2010) A generator for unique quantum random numbers based on vacuum states. *Nature Photonics.* 4, 711-715.

Gerry C, Knight P. (2005) *Introductory Quantum Optics.* (Cambridge University Press).

Guo H, Tang W, Liu Y, Wei W. (2010) Truly random number generation based on measurement of phase noise of a laser. *Physical Review E.* 81, 051137 (4 pages).

Hai-Qiang M, Su-Mei W, Da Z, Jun-Tao C, Ling-Ling J, Yan-Xue H, Ling-An W. (2004) A Random Number Generator Based on Quantum Entangled Photon Pairs. *Chinese Phys. Lett.* 21, 1961-1964.

Ichimura K, Shiokawa N. (2008) Quantum communication apparatus and quantum communication method. United States Patent Publication US 2008/0232814 published Sep. 25, 2008.

ID Quantique. (2011) Quantis Random Number Generator product sheet Jul. 29, 2011.

Jennewein T, Achleitner U, Weihs G, Weinfurter H, Zeilinger A. (2000) A fast and compact quantum random number generator. *Review of Scientific Instruments.* 71(4), 1675-1680.

Juels A, Jakobsson M, Shriver E, Hillyer B. (2000) How to turn loaded dice into fair coins. *Information Theory, IEEE Transactions.* 46, 911-921.

Kocarev L, Stojanovski T, Rizzotto G, Italia F, Porto D. (2003) Method for generating a random number sequence and a relative random bit generator. United States Patent Publication US 2003/0219119 published Nov. 27, 2003.

Kuninori S, Yohei K, Shoichi U, Takahiro M, Tetsuya A. (2009) Random number generation device and random number generation method. Japanese Patent Publication JP 2009-070009 published Apr. 2, 2009.

Lee K, Sussman B J, Nunn J, Lorenz V, Reim K, Jaksch D, Walmsley I, Spizzirri P, Prawer S. (2010) Comparing phonon dephasing lifetimes in diamond using transient coherent ultrafast phonon spectroscopy. *Diamond and Related Materials.* 19, 1289-1295.

Luo Y, Chan K T. (2006) Quantum random number generators. United States Patent Publication US 2006/0288062 published Dec. 21, 2006.

Marsaglia G. (1995) Diehard battery of tests of randomness.

Qi B, Chi Y M, Lo H K, Qian L. (2009) Experimental demonstration of a high speed quantum random number generation scheme based on measuring phase noise of a single mode laser. arXiv:0908.3351v2.

Qi B, Chi Y M, Lo H K, Qian L. (2010) High-speed quantum random number generation by measuring phase noise of a single-mode laser. *Optics Letters.* 35(3), 312-314.

Raymer M, Walmsley I A. (1990) Quantum coherence properties of stimulated raman scattering. *Progress in Optics.* 28, 181.

Raymer M G, Mostowski J. (1981) Stimulated raman scattering: Unified treatment of spontaneous initiation and spatial propagation. *Phys. Rev. A* 24, 1980-1993.

Reidler I, Aviad Y, Rosenbluh M, Kanter I. (2009) Ultrahigh-speed random number generation based on a chaotic semiconductor laser. *Physical Review Letters.* 103, 024102 (4 pages).

Ren M, Wu E, Liang Y, Jian Y, Wu G, Zeng H. (2011) Quantum random-number generator based on a photon-number-resolving detector. *Phys. Rev. A.* 83, 023820 (4 pages).

Shen Y, Tian L, Zou H. (2010) Practical quantum random number generator based on measuring the shot noise of vacuum states. *Phys. Rev. A.* 81, 063814 (5 pages).

Stefanov A, Gisin N, Guinnard O, Guinnard L, Zbinden H. (1999) Optical quantum random number generator. *Systems Science.* Vol. 47. arXiv:quant-ph/9907006v1.

Suryadi, Norzaliman Bin Mohd Z M, Wahiddin M R. (2010) Method and apparatus for quantum-mechanically generating a random number. International Patent Publication WO 2010/033013 published Mar. 25, 2010.

Tomaru T, Sasaki S, Hammura K. (2009) Cryptographic-key-generation communication system. U.S. Pat. No. 7,596,322 issued Sep. 29, 2009.

Tomaru T. (2010) Secure optical communication system. U.S. Pat. No. 7,738,793 issued Jun. 15, 2010.

Trifonov A, Vig H. (2007) Quantum noise random number generator. U.S. Pat. No. 7,284,024 issued Oct. 16, 2007.

Vartsky D, Bar D, Gilad P, Schon A. (2008) High-speed, true random-number generator. United States Patent Publication US 2008/0040410 published Feb. 14, 2008.

von Neumann J. (1951) Various techniques used in connection with random digits. *Nat. Bur. Stand., Appl. Math Ser.* 12, 36-38.

Wahl M, Leifgen M, Berlin M, Rohlicke T, Rahn H J, Benson O. (2011) An ultrafast quantum random number generator with provably bounded output bias based on photon arrival time measurements. *Applied Physics Letters*. 98, 171105.

Wei W, Guo H. (2009) Bias-free true random-number generator. *Opt. Lett.* 34, 1876-1878.

Williams C R S, Salevan J C, Li X, Roy R, Murphy T E. (2010) Fast physical random number generator using amplified spontaneous emission. *Optics Express*. 18(23), 23584-23597.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A method of generating a random number comprising:
    applying pulses of energy to amplify a quantum mechanical vacuum fluctuation by transient Raman scattering interactions in a medium, where said transient Raman scattering interactions generate one or more macroscopic fields having phase that is random and measurable; and
    measuring the phase to obtain a value for the phase, the value of the phase being a random number.

2. The method according to claim 1, wherein the quantum mechanical vacuum fluctuation arises from the Raman scattering interaction.

3. The method according to claim 1, wherein the pulses of energy are pulses of light energy.

4. The method according to claim 3, wherein the pulses of light energy have durations in a range of 2 attoseconds to 1 millisecond.

5. The method according to claim 3, wherein each pulse of light energy has a duration of 100 picoseconds or less.

6. The method according to claim 3, wherein each pulse of light energy has a duration in a range of from 1 femtosecond to 1 picosecond.

7. The method according to claim 1, wherein the value for the phase of the field is a real number that when converted to binary generates more than one random bit.

* * * * *